United States Patent
Hwang et al.

(10) Patent No.: US 6,430,732 B1
(45) Date of Patent: Aug. 6, 2002

(54) METHOD FOR STRUCTURED LAYOUT IN A HARDWARE DESCRIPTION LANGUAGE

(75) Inventors: L. James Hwang, Menlo Park; Cameron D. Patterson, Los Gatos; Sujoy Mitra, Cupertino, all of CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 09/246,253

(22) Filed: Feb. 8, 1999

Related U.S. Application Data

(63) Continuation-in-part of application No. 09/049,598, filed on Mar. 27, 1998, now Pat. No. 6,237,129.

(51) Int. Cl.[7] .......................... G06F 17/50; G06F 9/455
(52) U.S. Cl. ................................ 716/11; 716/8; 716/9
(58) Field of Search ................................. 716/11, 8, 9

(56) References Cited

U.S. PATENT DOCUMENTS

| | | |
|---|---|---|
| 4,554,625 A | 11/1985 | Otten |
| 4,918,614 A | 4/1990 | Modarres et al. |
| 5,208,491 A | 5/1993 | Ebeling et al. |
| 5,311,443 A | 5/1994 | Crain et al. |
| 5,351,197 A | 9/1994 | Upton et al. ................ 364/491 |
| 5,394,338 A | 2/1995 | Shinohara et al. .......... 364/491 |
| 5,408,665 A | 4/1995 | Fitzgerald |
| 5,446,675 A | 8/1995 | Yoshimura |
| 5,491,640 A | 2/1996 | Sharma et al. |
| 5,499,192 A | 3/1996 | Knapp et al. ................ 364/489 |
| 5,519,627 A | 5/1996 | Mahmood et al. .......... 364/488 |
| 5,519,629 A | 5/1996 | Snider |
| 5,519,630 A | 5/1996 | Nishiyama et al. ......... 364/490 |
| 5,568,395 A | 10/1996 | Huang |
| 5,594,657 A | 1/1997 | Cantone et al. |
| 5,602,754 A | 2/1997 | Beatty et al. |
| 5,604,680 A | 2/1997 | Bamji et al. |
| 5,612,893 A | 3/1997 | Hao et al. ................... 364/491 |
| 5,615,124 A | 3/1997 | Hemmi et al. |
| 5,636,125 A | 6/1997 | Rostoker et al. |
| 5,640,327 A | 6/1997 | Ting |

(List continued on next page.)

FOREIGN PATENT DOCUMENTS

GB      2306728    *   5/1997

OTHER PUBLICATIONS

Guccione, S. A. et al., A Data Parallel Programming Model for Reconfigurable Architectures, IEEE Workshop on FPGAs for Custom Computing Machines, pp. 79–87, Apr. 1993.*

D. Galloway, The Transmogrifier C Hardware Description Language and Compiler for FPGAs, IEEE Symposium on FPGAs for Custom Computing Machines, pp. 136–144, Apr. 1995.*

C. Iseli et al., A C++Compiler for FPGA Custom Execution Units Synthesis, IEEE Symposium on FPGAs for Custom Computing Machines, pp. 173–179, Apr. 1995.*

(List continued on next page.)

*Primary Examiner*—Matthew Smith
*Assistant Examiner*—A. M. Thompson
(74) *Attorney, Agent, or Firm*—LeRoy D. Maunu

(57) ABSTRACT

A method is provided for structured layout of design objects in a hardware description language (HDL). Standard features of the HDL are used to specify a first-level design object and the placement of other design objects in the first-level design object. A first-level design object is declared, wherein the first design object has no input or output ports and has one or more slots available for one or more second-level design objects. Values are assigned to attributes of the first-level design object to indicate placement for the second-level design objects within the first-level design object. The second-level design objects are declared as elements within the first-level design object, and the first- and second-level design objects are thereafter compiled.

17 Claims, 4 Drawing Sheets

U.S. PATENT DOCUMENTS

| | | | |
|---|---|---|---|
| 5,649,100 A | 7/1997 | Ertel et al. ................. | 709/225 |
| 5,696,693 A | 12/1997 | Aubel et al. | |
| 5,717,928 A | 2/1998 | Campmas et al. | |
| 5,754,441 A | 5/1998 | Tokunoh et al. | |
| 5,757,658 A | 5/1998 | Rodman et al. ............ | 364/491 |
| 5,774,370 A | 6/1998 | Giomi | |
| 5,818,254 A | 10/1998 | Agrawal et al. | |
| 5,818,728 A | 10/1998 | Yoeli et al. | |
| 5,828,588 A | 10/1998 | Grant ........................ | 364/718 |
| 5,838,165 A | 11/1998 | Chatter | |
| 5,838,583 A | 11/1998 | Varadarajan et al. | |
| 5,841,663 A | 11/1998 | Sharma et al. .............. | 364/490 |
| 5,892,678 A | 4/1999 | Tokunoh et al. | |
| 5,937,190 A | 8/1999 | Gregory et al. | |
| 5,946,219 A | 8/1999 | Mason et al. | |
| 5,946,486 A | 8/1999 | Pekowski | |
| 5,995,744 A | 11/1999 | Guccione | |
| 6,023,742 A | 2/2000 | Ebeling et al. | |
| 6,026,228 A | 2/2000 | Imai et al. | |
| 6,059,838 A | 5/2000 | Fraley et al. | |
| 6,078,736 A | 6/2000 | Guccione | |
| 6,080,204 A | 6/2000 | Mendel | |
| 6,167,363 A * | 12/2000 | Stapleton ..................... | 703/14 |
| 6,170,080 B1 | 1/2001 | Ginetti et al. | |
| 6,216,252 B1 | 4/2001 | Dangelo et al. | |
| 6,216,258 B1 | 4/2001 | Mohan et al. | |
| 6,237,129 B1 | 5/2001 | Patterson et al. | |
| 6,243,851 B1 | 6/2001 | Hwang et al. | |

OTHER PUBLICATIONS

P. Bondono et al., NAUTILE: A Safe Environment for Silcon Compilation, Proceedings of the European Design Automation Conference, pp. 605–609, Mar. 1990.*

J. Conway et al., A New Template Based Approach to Module Generation, 1990 IEEE International Conference on Computer–Aided Design, pp. 528–531, Nov. 1990.*

I. Page, The HARP Reconfigurable Computing System, Oxford University Hardware Compilation Group, pp. 1–7, Oct. 1994.*

T. J. Sheffler et al., An Object–Oriented Approach to Nested Data Parallelism, Fifth Symposium on the Frontiers of Massively Parallel Computation, pp. 203–210, Feb. 1995.*

M. Weinhardt et al., Pipeline Vectorization for Reconfigurable Systems, Seventh Annual IEEE Symposium on Field–Programmable Custom Computing Machines, pp. 52–62, Apr. 1999.*

"Xilinx Libraries Guide", published 10/95, pp. 4–71 to 4–97 available from Xilinx, Inc., at 2100 Logic Drive, San Jose, CA 95124.*

"The Programmable Logic Data Book 1998", pp. 4–5 to 4–69, published by Xilinx, Inc., at 2100 Logic Drive, San Jose, CA 95124.*

"The Programmable Data Logic Book", copyright Sep. 1996, pp. 4–5 to 4–78, Xilinx, Inc., at 2100 Logic Drive, San Jose, CA, 95214.*

"XC4000 Family Hard Macro Style Guide", published Sep. 3, 1991, and available from Xilinx, Inc., at 2100 Logic Drive, San Jose, CA 95124.*

"X–BLOX User Guide", published Apr. 1994, pp. 1–1 to 2–14 and 4–36 to 4–46, available from Xilinx, Inc., 2100 Logic Drive, San Jose CA 95124.*

"CORE Solutions Data Book", copyright 1997, pp. 4–3 to 4–4 and 2–3 to 2–91, available from Xilinx, Inc., 2100 Logic Drive, San Jose CA 95124.*

"Automated Layout of Integrated Circuits", pp. 113–195 of "Design Systems for VLSI Circuits", edited by G. De Micheli, A. Sangiovanni–Vincentelli, and P.Antognetti, published 1987, by Martinus Nijhoff Publishers.*

Natesan et al.; "A Constructive Method for Data Path Area Estimation During High–Level VLSI Synthesis"; IEEE 1997; pp. 509–515.

Jiang et al.; "A New Self–Organization Strategy for Floorplan Design"; IEEE 1992; II–510–II–515.

Hwang et al.; "VHDL Placement Directives for Parametric IP Blocks"; IEEE 1999; pp. 284–285.

K. Pocek et al., "Optimizing FPGA–based Vector Product Designs, Symposium on Field–Programmable Custom Computing Machiines", Apr., 1999, pp. 188–197.

Bin–Da Liu et al., "An Efficient Algorithm for Selecting Biparite Rcw or Column Folding of Programmable Logic Arrays", IEEE Transactions on Circuits and Systems, Jul., 1994, pp. 494–498.

S. A., Guccione et al., "A Data Parallel Programming Model for Reconfigurable Architectures", Apr., 1993, pp. 79–87.

K. Pocek et al., "JHDL–AN HDL for Reconfigurable Systems, FPGA for Custom Computing Machines", Apr. 1998, pp. 175–184.

B. Hutchings et al., "A CAD Suite for High–Performance FPGA Design", IEEE Symposium on Field–Programmable Custom Computing Machines, Apr., 1999, pp. 12–24.

S. C. Goldstein et al., PipeRench: "A Reconfigurable Architecture and Compiler", Apr., 2000, pp. 70–77.

S. Tarafdar et al., "Integrating Floorplanning In Data–Transfer Based on High Level Synthesis", 1998 IEEE/ACM Conference on Computer–Aided Design, pp. 412–417.

K. Bazargan et al., Nostradamus: A Floorplanner of Uncertain Designs, IEEE Transactions on Computer–Aided Design of Integrated Circuits and Systems, 1999, pp. 389–397.

Yamazaki, Takao et al., "A Top Down for Data Path Design", Sep. 1993, Proceedings of the Sixth Annual IEEE International ASIC Conference and Exhibit, pp. 266–269.

Evolution User's Guide [online] Morphologic., [retrieved on Sep. 1, 1999]. Retrieved from the Internet: http://www.morphologic.com.

Mencer, O. et al., PAM–Blox: High Performance FPGA Design for Adaptive Computing, FPGAs for Custom Computing Machines, Apr. 1998, proceedings. IEEE Symposium on., pp. 167–174.

Kelem., S. H., et al., Shortening the Design Cycle for Programmable Logic, IEEE Design & Test of Computers, Dec. 1992, pp. 40–50.

Usami, K. et al., Hierarchical Symbolic Design Methodology for Large–Scale Data Paths, IEEE Journal of Solid State Circuits, Mar. 1991, pp. 381–385.

Engel, R. et al., Making Design Patterns Explicit in FACE, Proceedings of the 6th European Conference, Sep. 1997, pp. 94–110.

N. Gefland, Teaching Data Structure Design Patterns, Proceedings of the 29th SIGCSE Technical Symposium, Feb. 1998, pp. 331–335.

Kortright, E.V., Modeling and Simulation with UML and Java, Simulation Symposium, Proceedings., 30th Annual, Apr. 1997, pp. 43–48.

Kelem, S. H. et al., Context–based ASIC Synthesis, Euro ASIC '92, Proceedings, pp. 226–231.

Brasen, D. R., Mhertz: A New Optimization Algorithm for Floorplanning and Global Routing, Design Automation Conference, Jun. 1990, Proceedings., 27th ACM/IEEE.

Smith, William D. et al., Flexible Module Generation in the FACE Design Environment, IEEE International Conference on Computer–Aided Design, Nov. 1988, pp. 396–399.

M. Evered et al., Genja—A New Proposal for Parameterised Types in Java, Technology of Object–Oriented Languages and Systems, Nov. 1997, pp. 181–193.

M. Odersky et al., Leftover Curry and reheated Pizza: How functional programming nourishes software reuse, Fifth International Conference on, Jun. 1998, pp. 2–11.

B. Djafri et al., OOVHDL: Object Oriented VHDL, VHDL International Users'Forum, Oct. 1997, pp. 54–59.

W. Wolf, How to Build a Hardware Description and Measurement System on an Object–Oriented Programming Language, IEEE Transactions on Computer–Aided Design, Mar. 1989, pp. 288–301.

P. Bellows et al., JHDL—An HDL for Reconfigurable Systems, IEEE Symposium on FPGAs for Custom Computing Machines, Apr. 1998, pp. 175–184.

D. W. Knapp et al., The ADAM Design Planning Engine, Computer–Aided Design on Integrated Circuits and Systems, Jul. 1991, pp. 829–846.

J. Granacki et al., The ADAM Advanced Design Automation System, ACM/IEEE Conference on Design Automation, Apr. 1985, pp. 727–730.

Wayne Wolf, An Object–Oriented, Procedural Database for VLSI Chip Planning, ACM/IEEE Conference on Design Automation, Apr. 1986, pp. 744–751.

Mohanty et al., "SCUBA: An HDL Data–Path/Memory Module Generator for FPGAs," IEEE, pp. 135–142.

Andersson et al., "Interaction Semantics of a Symbolic Layout Editor for Parameterized Modules," IEEE, pp. 1096–1106.

Kim et al., "An Analog Layout Floorplanner Using its Parameterized Module Layout Structure," IEEE, pp. 397–400.

Tsareff et al., "An Expert System Approach to Parameterized Module Synthesis," IEEE, pp. 28–36.

"The Programmable Logic Data Book 1998", pp. 4–5 to 4–69, published by Xilinx, Inc., located at 2100 Logic Drive, San Jose, California 95124.

Lechner E. et al: "The Java Environment for Reconfigurable Computing" Field–Programmable Logic and Applications. 7th International Workshop, FPL '97. Proceedings, London, UK, Sep. 1–3, 1997, pp. 284–293, XP002086682 ISBN 3–540–63465–7, Berlin, Germany, Springer–Verlag, Germany.

Pottier B. et al: "Revisiting Smalltalk–80 blocks: a logic generator for FPGAs", Proceedings. IEEE Symposium on FPGAs for Custom Computing Machines (CAT. No. 96TB100063), Napa Valley, CA, USA, Apr. 17–19, 1996, pp. 48–57, XP002103589 ISBN 0–8186–7548–9, 1996, Los Alamitos, CA, USA.

Swamy S. et al.: "00–VHDL Object–Oriented Extensions to VHDL", Computer vol. 28, No. 10, Oct. 1, 1995, pp. 18–26, XP000535917.

Dekker R. et al. "HDL Synthesis for FPGA Design" Electronic Engineering, vol. 66, No. 814, Oct. 1, 1994, p. S43/44, 46 XP000471392.

Maxfield C: "LPMS: High–Level Design Uses Low–Level Techniques" EDN Electrical Design News, vol. 41, No. 10, May 9, 1996, pp. 125–131, XP00597964.

Hwang J. et al.: "Generating Layouts for Self–Implementing Modules", Field–Programmable Logic and Applications. From FPGAs to Computing Paradigm. 8th International Workshop, FPL, Aug. 31, 1998, pp. 525–529, XP002103590, ISBN 3–540–64948–4, 1998, Berlin, Germany, Springer–Verlag, Germany.

* cited by examiner

METHOD FOR STRUCTURED LAYOUT IN A HARDWARE DESCRIPTION LANGUAGE

CROSS-REFERENCE TO RELATED APPLICATIONS

The present invention is a continuation-in-part of the patent application entitled, "METHOD FOR CONSTRAINING CIRCUIT ELEMENT POSITIONS IN STRUCTURED LAYOUTS," by Patterson et al. having Ser. No. 09/049,598 and a filing date of Mar. 27, 1998, now issued as U.S. Pat. No. 6,237,129 B1 and assigned to the assignee of the present invention, the content of which is incorporated herein by reference.

The following patent applications are also incorporated herein by reference:

"METHOD FOR REMAPPING LOGIC MODULES TO RESOURCES OF A PROGRAMMABLE GATE ARRAY" by,Hwang et al., filed on Jan. 19, 1999, Ser. No. 09/234,010; and "CONTEXT-SENSITIVE SELF IMPLEMENTING MODULES" by Dellinger et al., filed on Mar. 27, 1998, Ser. No. 09/049,891 and now issued as U.S. Pat. No. 6,292,925 B1.

FIELD OF THE INVENTION

The present invention generally relates to hardware description languages (HDLs), and more particularly to template-based layout specification using constructs generally provided by the languages.

BACKGROUND OF THE INVENTION

Field programmable gate arrays (FPGAs), first introduced by Xilinx, Inc. in the 1980's, are becoming increasingly popular devices for use in electronics systems. For example, communications systems employ FPGAs in large measure for their re-programmability. In general, the use of FPGAs continues to grow at a rapid rate, because they permit relatively short design cycles, reduce costs through logic consolidation, and offer flexibility in their re-programmability. One such FPGA, the Xilinx XC4000™ Series FPGA, is described in detail in pages 4–5 through 4–69 of the Xilinx 1998 Data Book entitled "The Programmable Logic Data Book 1998", published in 1998 and available from Xilinx, Inc., 2100 Logic Drive, San Jose, Calif. 95124, which pages are incorporated herein by reference. (Xilinx, Inc., owner of the copyright, has no objection to copying these and other pages referenced herein but otherwise reserves all copyright rights whatsoever.)

As FPGA designs increase in complexity, they reach a point at which the designer cannot deal with the entire design at the gate level. Where once a typical FPGA design comprised perhaps 5,000 gates, FPGA designs with 50,000 gates are now common, and FPGAs supporting over 300,000 gates are available. To deal with this complexity, circuits are typically partitioned into smaller circuits that are more easily handled. Often, these smaller circuits are divided into yet smaller circuits, imposing on the design a multi-level hierarchy of logical blocks.

Libraries of pre-developed blocks of logic have been developed that can be included in an FPGA design. Such library modules include, for example, adders, multipliers, filters, and other arithmetic and DSP functions from which complex designs can be readily constructed. The use of pre-developed logic blocks permits faster design cycles by eliminating the redesign of circuits. Thus, using blocks of logic from a library may reduce design costs. However, the circuit that results when combining predefined logic blocks may have sub-optimal circuit performance.

Many high-performance FPGA circuits require customized layouts to achieve required performance levels. However, present methods are not particularly conducive to convenient, error-free specification of layouts. For example, module floorplans can be specified with component placement constraints that are x, y, and s coordinates, where x and y are either constants or arithmetic expressions, and s is a device site such as a particular lookup table. However, determining and maintaining these expressions for complex floorplans can be difficult and error-prone, particularly when the modules are hierarchical.

A method that address the aforementioned problems, as well as other related problems, is therefore desirable.

SUMMARY OF THE INVENTION

In various embodiments, the invention provides a method for structured layout of design objects in a hardware description language (HDL). The present method provides placement directives that use standard features of the HDL instead of special extensions to the HDL or comment-based placement annotations. Thus, the placement directives are compatible with any tool adhering to the HDL specification. In addition, the placement directives do not require coordinate-based specification of design objects, thereby alleviating the involved and error-prone specification and maintenance of coordinates for a complex hierarchical design.

In accordance with one embodiment, a method is provided for structured layout of design objects in a hardware description language (HDL). Standard features of the HDL are used to specify a first-level design object and placement of other design objects within the first-level design object. A first-level design object is declared, wherein the first-level design object has no input or output ports and has one or more slots available for one or more second-level design objects. Values are assigned to attributes of the first-level design object to indicate placement for the second-level design objects within the first-level design object. The second-level design objects are declared as elements within the first-level design object, and the first and second-level design objects are thereafter compiled.

The above summary of the present invention is not intended to describe each disclosed embodiment of the present invention. The figures and detailed description that follow provide additional example embodiments and aspects of the present invention.

BRIEF DESCRIPTION OF THE DRAWINGS

Various aspects and advantages of the invention will become apparent upon review of the following detailed description and upon reference to the drawings, in which.

Figure 1:
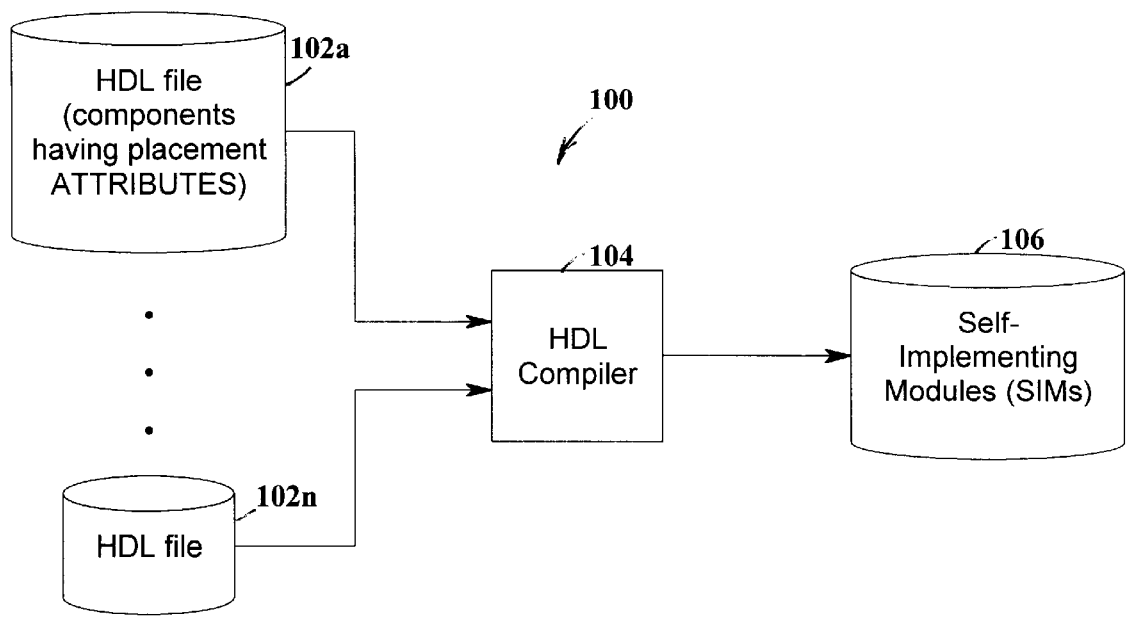
FIG. 1 is a block diagram that illustrates how the placement directives can be used in an example system.

While the invention is susceptible to various modifications and alternative forms, specific embodiments thereof have been shown by way of example in the drawings and will herein be described in detail. It should be understood, however, that the detailed description is not intended to limit the invention to the particular forms disclosed. On the contrary, the intention is to cover all modifications, equivalents, and alternatives falling within the spirit and scope of the invention as defined by the appended claims.

DETAILED DESCRIPTION OF THE DRAWINGS

The present invention is believed to be applicable to a variety of systems for laying out designs for programmable logic devices. The present invention has been found to be particularly applicable and beneficial for design systems used to lay out designs using the "Very high speed integrated circuit Hardware Description Language" (VHDL). While the present invention is not so limited, an appreciation of the present invention is presented by way of specific VHDL examples.

The various embodiments of the invention support a template-based method for specifying placement of design objects in abstract coordinates that are independent of the sizes of the placed design objects. The specification of placement information is accomplished with "placement directives." The placement directives can be viewed as an embedded language for specifying layouts. Rather than using arithmetic expressions to define placement, the placement directives language provides templates that allow a hierarchical floorplan specification to match the floorplan itself. The template-based placement directives facilitate the composition and reuse of placement-optimized modules and hide from the specification extraneous architectural details that are FPGA architecture specific.

The "language" is embedded in VHDL using conventional syntax for ATTRIBUTE statements, in accordance with an example embodiment. Words in uppercase in this description are generally VHDL keywords. While the embodiments described herein may be viewed as an "embedded language," it will be appreciated that the placement directives of the present invention do not rely on special extensions to the HDL (in this embodiment, VHDL) nor are the placement directives embedded in comments associated with the HDL. These two characteristics of the placement directives support compatibility of designs having the placement directives with various tools for processing the HDL. For example, a design having the VHDL placement directives described herein should be compatible with any tools that are compliant with the VHDL standard.

The placement directives are specified by creating templates of selected types. Templates are also referred to herein as "containers." The template types support various geometric and positional relations of components or "design objects" contained therein. As indicated by the various examples below, elements of a template can include any instantiated component or other templates.

In the example embodiment, the template types are defined as components in a VHDL PACKAGE and include the types: indivisible, flexible, vector, overlap, interleave, remap, and RPM. An example declaration in a VHDL PACKAGE is:

COMPONENT pldir_vector
END COMPONENT;

Note that the "pldir_" prefix is used to uniquely identify the placement directive template types, as well as the placement directive ATTRIBUTEs. Declarations for the other template types in the package are similar.

The indivisible template type has a single element that is fully placed and unalterable. Templates of this type correspond to architectural primitives with fixed structure and form the leaves (i.e., the lowest-level elements) of a template hierarchy.

The flexible template type has unplaced elements. The floorplan of a flexible template can be computed during global placement.

The vector template type defines a linear order of its constituent elements, either in a row or a column. The elements need not be of the same type or size.

The overlap template type has elements that are superimposed without resource conflict resolution. In other words, an overlap object defines placement of the elements one on another in the template. If several constituents require the same resource, an evaluation error is detected.

The interleave template type is a vector of vectors whose elements are shuffled. Various patterns can be specified by defining a pattern or order.

The remap template type is a template used to combine design objects one with another, in which combinational resource overlaps are resolved, consistent with the underlying device resource. Remap templates are described in more detail in the co-pending patent application, "METHOD FOR REMAPPING LOGIC MODULES TO RESOURCES OF A PROGRAMMABLE GATE ARRAY," referenced above.

The RPM (relationally placed macro) type template has elements with a specified relative placement. An RPM has elements with placements defined in device coordinates with respect to the container's origin. RPMs and their method of coordinate specification are described on pages 4–71 through 4–97 of the "Xilinx Libraries Guide," published October 1995 and available from Xilinx, Inc., which pages are incorporated herein by reference.

Each template type is declared as a VHDL COMPONENT having no input or output ports. Layout properties of a template are specified in ATTRIBUTE statements. Having no ports ensures that the template components do not affect simulation results, while using standard VHDL syntax ensures that the placement attributes are not stripped away by other tools.

The template attributes allow a designer to specify alignments, offsets, folding, and other layout characteristics of a template. For example, an attribute can be used to indicate a number of slots to be filled, or a number of design objects to be placed, in a row or column vector before commencing filling another row or column. The attributes may be attached to any component that is an element of a placement directive component. Example ATTRIBUTE statements that are included in the VHDL package for the above-described template types are set forth below. In the example statements, comments follow a double dash, "--".

ATTRIBUTE pldir_container: STRING;
  --the name of the template
  --The x_coord and y_coord are only applicable to
    RPM template
  --types
ATTRIBUTE pldir_x_coord: INTEGER;
  --origin of 0 at left
ATTRIBUTE pldir_y_coord: INTEGER;
  --origin of 0 at bottom
  --The row_alignment, col_alignment, and index
    attributes may
  --only be attached to components with a container that
    is a
  --vector, overlap, or interleave template. Note that
  --row_alignment should be used if the container is a
    row, and --col_alignment should be used if the container is a column
ATTRIBUTE pldir_row_alignment: INTEGER;
--default is towards
--pldir_bottom
ATTRIBUTE pldir_col_alignment: INTEGER;
--default is towards
--pldir_left
ATTRIBUTE pldir_index: INTEGER;
--an element's ordered
--position in the template
--The following attributes are specific to vector and
--interleave templates
ATTRIBUTE pldir_orientation: INTEGER;
--value is either
--pldir_row or
--pldir_column
ATTRIBUTE pldir_row_direction: INTEGER;
--value is either
--pldir_from_left or
--pldir_from_right
ATTRIBUTE pldir_col_direction: INTEGER;
--value is either
--pldir_from_top or
--pldir_from_bottom
ATTRIBUTE pldir_row_fold INTEGER;
--value is either
--pldir_top or pldir_bottom
ATTRIBUTE pldir_col_fold: INTEGER;
--value is either
--pldir_left or pldir_right
ATTRIBUTE pldir_fold_size INTEGER;
--value indicates fold
--after number of elements
ATTRIBUTE pldir_fold_length: INTEGER;
--value indicates fold
--after number of grid
--positions
ATTRIBUTE pldir_offset: INTEGER;
--value indicates offset into
--container
ATTRIBUTE pldir_stride: INTEGER;
--value indicates distance
--between sides of elements
ATTRIBUTE pldir_zigzag: BOOLEAN;
--value indicates wind for
--folds
--The pattern attribute is only applicable to interleave
--templates
ATTRIBUTE pldir_pattern: STRING;
--defines shuffle pattern
--for an interleave template The values for the above-referenced attributes are specified with CONSTANT declarations in the package. For example, the value for pldir_left can be declared as follows:

CONSTANT pldir_left: INTEGER:=0;

It will be appreciated that different constant values are used to distinguish between, for example, pldir left and pldir_right.

FIG. 1 is a block diagram that illustrates how the placement directives can be used in an example system. The example system 100 includes an assortment of HDL input files 102a–102n, an HDL compiler 104, and one or more output files that contain self-implementing modules (SIMs).

SIMs are described by Dellinger et al in the co-pending U.S. patent application "CONTEXT-SENSITIVE SELF IMPLEMENTING MODULES," referenced above.

As described above and further explained in the examples below, the HDL files 102a–102n specify a design for a circuit to be implemented on, for example, an FPGA. Placement directives in the form of components and attributes are included in selected ones of the HDL files.

An HDL compiler 104 translates the input HDL to the output SIMs. While example system 100 shows the translation of HDL files 102a–102n to SIMs 106, those skilled in the art will appreciate that other HDL compilers/tools, such as Model Tech VCOM and Synopsys VSS, can be used in alternative systems and embodiments. The alternative compilers/tools require no adaptation to process the templates and template hierarchy described herein, as long as the compilers/tools are VHDL compliant.

The following VHDL code is an example of a register module defined as a column of D-type flip-flips (DFFs) using a VHDL entity-architecture pair with the above-described placement directives. The register bit-width is specified with the GENERIC, bwid. The layout is specified by declaring a pldir_vector template, giving it a column orientation, and identifying the vector as the template for each of the constituent DFFs. It can be seen that the template syntax allows placement annotations to be combined naturally with the logical structure.

```
ENTITY regce IS
   GENERIC (bwid: INTEGER:=8);
      PORT (d: IN STD_LOGIC_VECTOR((bwid-1)
         DOWNTO 0);
         c: IN STD_LOGIC;
         q: OUT STD_LOGIC_VECTOR((bwid-1)
            DOWNTO 0));
END regce;
ARCHITECTURE pldir OF regce IS
   COMPONENT DFF
      PORT (D: IN STD_LOGIC:='0';
         C: IN STD_LOGIC:='0';
         Q: OUT STD_LOGIC);
   END COMPONENT;
   ATTRIBUTE pldir_orientation OF flop_col: LABEL
      IS pldir_column;
   ATTRIBUTE pldir_col_orientation OF flop_col:
      LABEL IS pldir_from_bottom;
BEGIN
   flop_col: pldir_vector;
   clb_array: FOR i IN 0 TO bwid-1 GENERATE
      ATTRIBUTE pldir_container OF flop: LABEL IS
         "flop_col";
      ATTRIBUTE pldir_index OF flop: LABEL IS i;
   BEGIN
      flop: DFF PORT MAP(d=>d(i), c=>c, ce=>ce, clr=
         >clr, pre=>pre, q=>q(i));
   END GENERATE;
END pldir;
```

The example VHDL code above defines a register as a column of flip-flops. The register ENTITY, regce, has a width of 8 and has data port d, clock port c, and output port q. The ARCHITECTURE definition for regce specifies D-type flip-flops (COMPONENT DFF), each having D, C, and Q ports.

Figure 2:
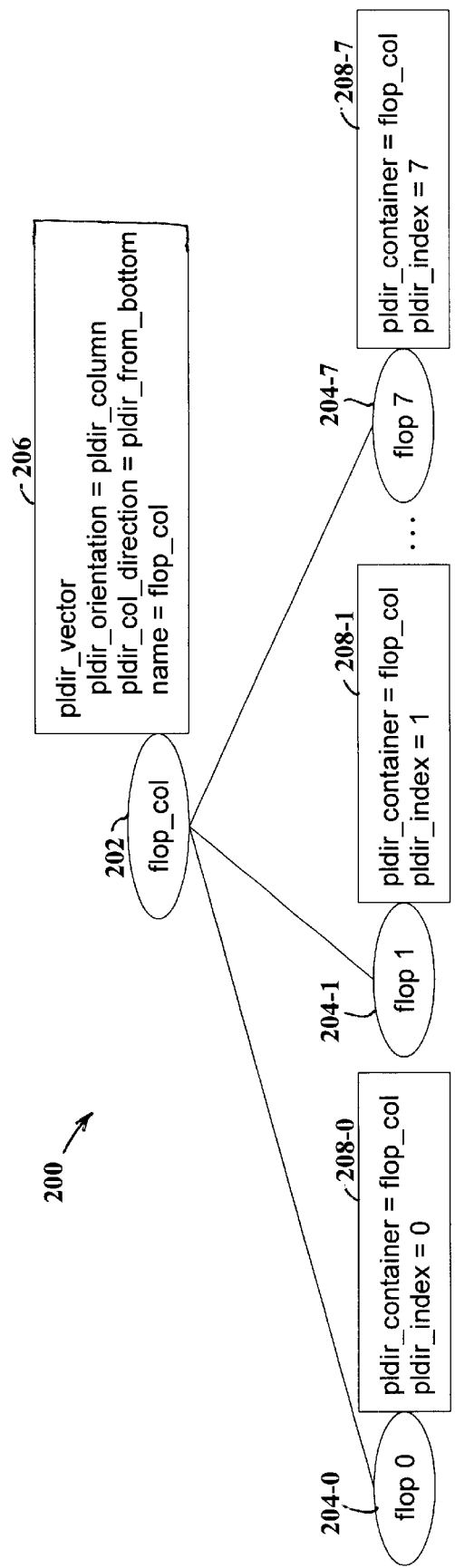
FIG. 2 is a graph that illustrates the hierarchical relationships between the components and attributes in the example VHDL code.

FIG. 2 is a graph 200 that illustrates the hierarchical relationships between the components and attributes in the example VHDL code. The components are shown as ovals 202 and 204-0, 204-1, . . . , 204-7, and the respectively associated attributes are shown as attached blocks 206, 208-0, 208-1, . . . 208-7. Graph 200 provides a hierarchical perspective for the preceding VHDL code, the description of which continues in the following paragraphs.

ATTRIBUTE statements are also included in the declarative block of the ARCHITECTURE. The ATTRIBUTE statements specify values (pldir_column and pldir_from_bottom) for the associated attributes (pldir_orientation and pldir_col_direction, respectively) for the indicated component (flop_col). The component "flop_col" is instantiated as a pldir_vector in the body of the ARCHITECTURE. Thus, the ATTRIBUTE statements along with the statement "flop_col: pldir_vector;" define and instantiate a vector named flop_col having a column orientation and indices that begin at the bottom of the column. The "cells" within the vector are defined with the remaining statements.

The component "clb_array" is instantiated with a GENERATE statement within a FOR statement. The attributes pldir_container and pldir_index of the component flop are assigned the values flop_col and i, respectively (where i ranges from 0 to 7). Thus, the component flop that is instantiated after the ATTRIBUTE statements is contained within the template flop_col. The statement, "flop: DFF PORT MAP . . . " instantiates a D-type flip-flop with the designated port maps. The variable "i" is incremented with each iteration of the statement to create the port maps for each of the 8 flip-flops (flop 0–flop 7) comprising the register. Thus, each instantiation of a flip-flop (i.e., each component flop), is placed in the template flop_col as indexed by the variable i. The placement of the component flop is accomplished with the values of the attributes pldir_container and pldir_index that are associated therewith.

It will be appreciated that when a simulator processes the example VHDL code, the "flop_col: pldir_vector" and "ATTRIBUTE . . . " statements are essentially ignored by virtue of their having no input or output ports. However, these same VHDL statements are used in translating the VHDL code to self-implementing modules (SIMS) as described by Dellinger et al in the co-pending patent application "CONTEXT-SENSITIVE SELF IMPLEMENTING MODULES," referenced above. The Java-based SIM that corresponds to the VHDL example code above is provided below.

```
public class regce extends Sim {
    public regce (int bwid, Net din, Net clk, Net q) {
        addPort ("d", Port.IN, bwid, din);
        addPort ("c", Port.IN, 1, clk);
        addPort ("q", Port.OUT, bwid, q);
        VectorTemplate column=new VectorTemplate (this,
            COLUMN);
        column.colDirection (FROM_BOTTOM);
        for (int i=0; i <bwid; i++)
            column.addSim (new DFF(din.ripNet(i), clk,
                q.ripNet(i)));
    }
}
```

Figure 3A:
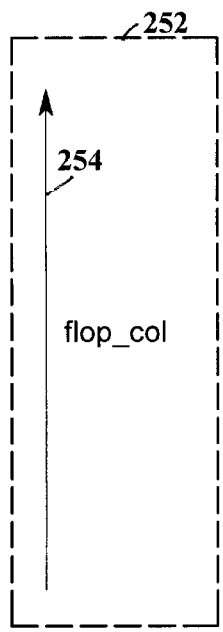
FIGS. 3A and 3B are block diagrams that illustrate instantiation of the vector-type template "flop_col" and instantiation of flops 0–7 in flop_col.
Figure 3B:
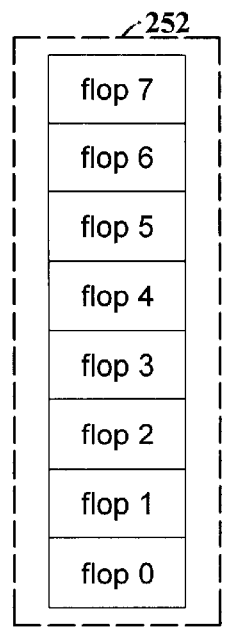

FIGS. 3A and 3B are block diagrams that illustrate the instantiation of the vector-type template flop_col and the instantiation of flops 0–7 in flop_col. Block 252 of FIG. 3A represents the vector-type template flop_col. As specified by the statements:

ATTRIBUTE pldir_orientation OF flop_col: LABEL IS pldir_column;
ATTRIBUTE pldir_col_orientation OF flop_col: LABEL IS pldir_from_bottom;

flop_col has a column orientation and the components are placed therein from the bottom to the top. Directional line 254 illustrates the column orientation and the direction in which the components are placed.

FIG. 3B illustrates template 252 after instantiating the DFFs (flops 0–7). It will be appreciated that flops 0–7 are instantiated from the bottom of flop_col to the top of flop_col in accordance with the declaration of flop_col as column vector with a direction attribute having a value of pldir_from_bottom.

The lexicographic order of component instantiation statements defines the order in which the corresponding components are created in the template. A component's attributes are created at instantiation time, and as a consequence, the syntactic order of component instantiation statements defines the order in which components are bound to an enclosing container. Instantiation of a template that occurs after instantiation of any component within the template is defined as a compile time error.

The following VHDL example illustrates how two registers can be instantiated with a hierarchy of templates. The top level of the hierarchy is a row vector containing two column vectors, each column vector corresponding to one of the registers. The example also illustrates how register names can be specified for internal generation.

Figure 4:
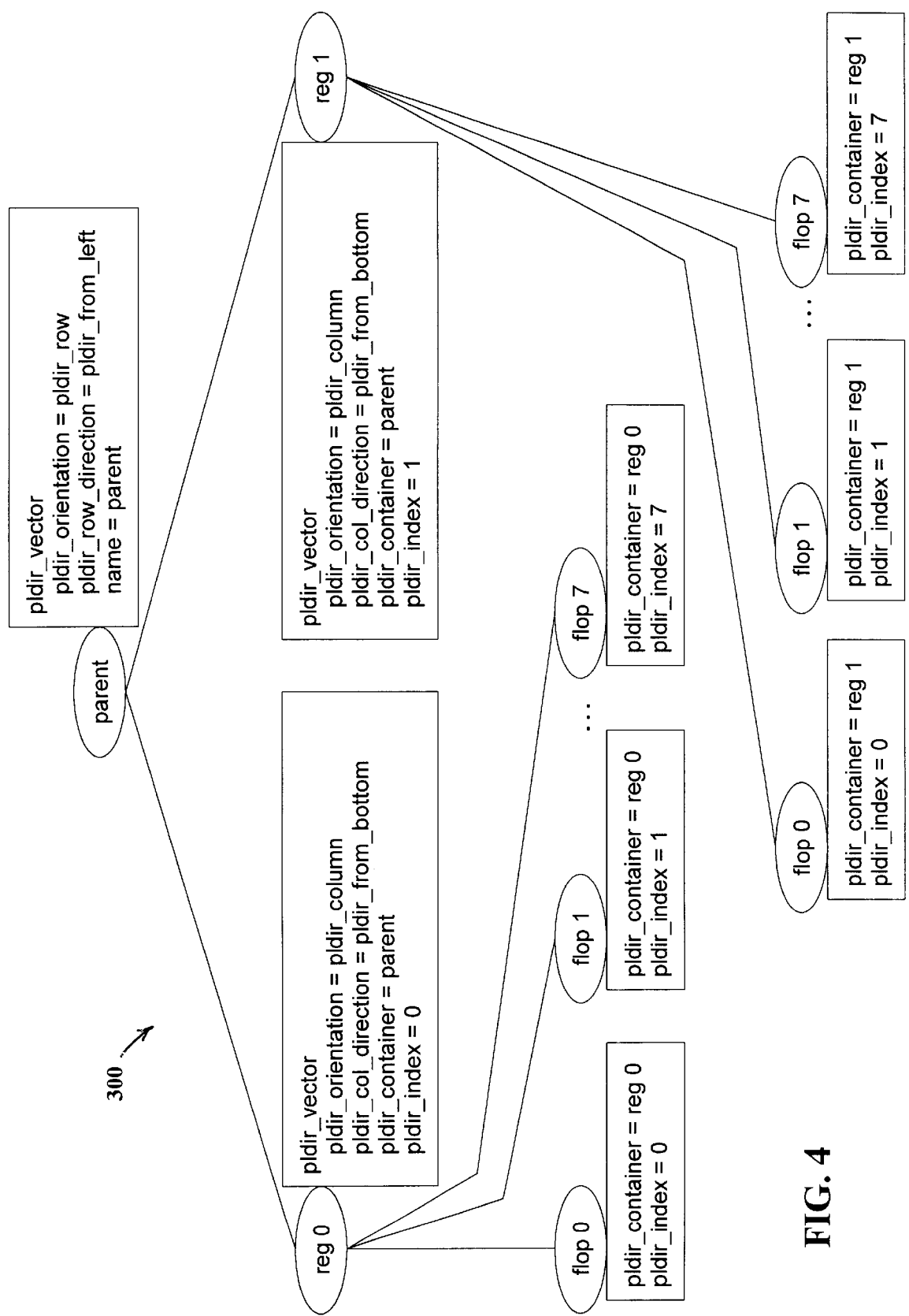
FIG. 4 is a graph that illustrates the hierarchical relationships between the parent, reg 0, and reg 1 templates and the respective flop components.

ARCHITECTURE flat OF two_registers
  ATTRIBUTE pldir_orientation OF parent: LABEL IS pldir_row;
  ATTRIBUTE pldir_row_direction OF parent: LABEL IS
    pldir from_left;
BEGIN
  parent pldir_vector;
  FOR i IN 0 TO 1 GENERATE
    ATTRIBUTE pldir_container OF reg: LABEL IS "parent";
    ATTRIBUTE pldir_orientation OF reg LABEL IS pldir_column;
    ATTRIBUTE pldir_index OF reg LABEL IS i;
    BEGIN
    reg: pldir_vector;
    FOR j IN 0 TO 7 GENERATE
      ATTRIBUTE pldir_container OF flop: LABEL IS "reg";
      ATTRIBUTE pldir_index OF flop: LABEL IS j;
      BEGIN
      flop: DFF GENERIC MAP ( . . . ) PORT MAP ( . . . );
      END GENERATE
    END GENERATE
END flat;

FIG. 4 is a graph 300 that illustrates the hierarchical relationships between the parent, reg 0, and reg 1 templates and the respective flop components. The parent template contains templates reg 0 and reg 1, and each of reg 0 and reg 1 contains respective sets of flop 0, flop 1, . . . , flop 7. The parent template is a row vector having a direction pldir_from_left. The templates reg 0 and reg 1 are both column vectors having a direction pldir_from_bottom. Thus, flops 0–7 that are constituents of reg 0 occupy reg 0 from the bottom to the top, and reg 0 occupies the leftmost position in the parent row vector. The constituent flops 0–7 of reg 1 occupy reg 1 from the bottom to the top, and reg 1 occupies the position to the right of reg 0 in the parent row vector.

Figure 5A:
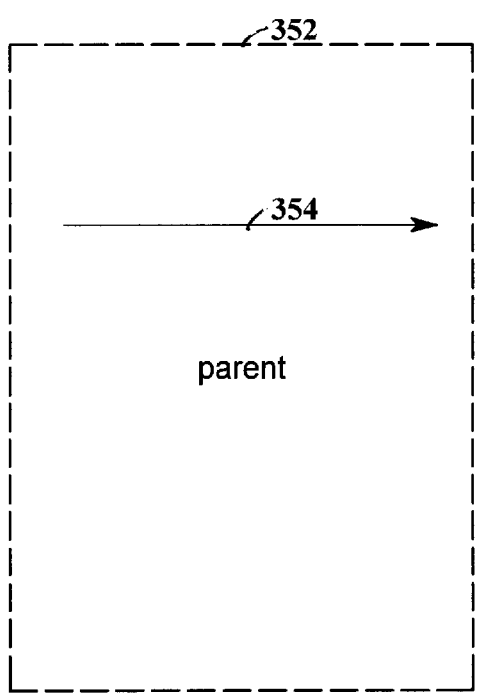
FIGS. 5A, 5B, and 5C are block diagrams showing the relative placements of the sets of flops 0–7 in the reg 0 and reg 1 templates in the parent template.
Figure 5B:
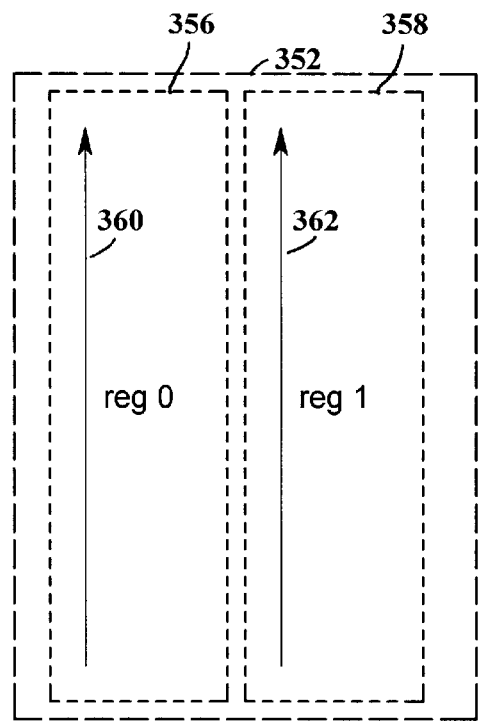
Figure 5C:
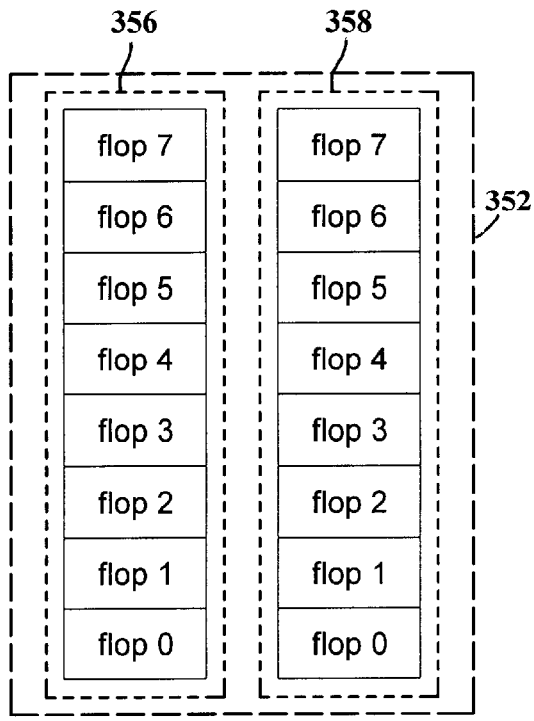

FIGS. 5A, 5B, and 5C are block diagrams showing the relative placements of the sets of flops 0–7 in the reg 0 and reg 1 templates in the parent template. Block 352 of FIG. 5A represents the parent template, and directional line 354 denotes that the parent template is a row vector with a left-to-right direction.

Blocks 356 and 358 respectively illustrate the templates reg 0 and reg 1 as contained in the parent template block 352. Both reg 0 and reg 1 are column templates having bottom-to-top directions, as shown by lines 360 and 362, respectively. Note that reg 0 occupies the leftmost position of the row vector parent, and reg 1 is placed immediately to the right of reg 0. Although both reg 0 and reg 1 are shown in FIG. 5B as having been instantiated without respective sets of flops 0–7, it will be appreciated that the actual order of instantiation is first instantiation of reg 0 and its constituent flops 0–7, and then instantiation of reg 1 and its constituent flops 0–7.

FIG. 5C is a block diagram that shows the final placement of the set of flops 0–7 in reg 0 (block 356) of the parent vector (block 352) and the set of flops 0–7 in reg 1 (block 358) of the parent vector. While the example shown in FIGS. 5A–5C illustrates a three-level hierarchy of design objects (parent, reg's 0 and 1, and respective sets of flops 0–7), it will be appreciated that additional levels of templates may be constructed for more complex arrangements.

While the example embodiments have been described in terms of VHDL, those skilled in the art will appreciate that the invention could be implemented in other embodiments using, for example, Verilog or other HDLs having language constructs comparable to components without input or output ports and attributes for associating with the components.

Example VHDL has been provided that illustrates relatively simple placements of components using vector templates. However, those skilled in the art will recognize that other more complicated layouts, as well as layouts using the other template types, can be specified using the example placement directive language constructs described herein. Therefore, the example VHDL templates should be interpreted as illustrative and not limiting.

Accordingly, the present invention provides, among other aspects, a process for structured layout of design objects in a hardware description language. Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A method for structured layout of design objects in a hardware description language, comprising:
   declaring a first design object, the first design object having no input ports and no output ports;
   assigning values to attributes of the first design object, the values of attributes indicative of placement for a set of design objects within the first design object;
   declaring a set of design objects as elements within the first design object, wherein one or more of the set of design objects have input ports and output ports;
   declaring a plurality of design objects of a first type, wherein design objects of the first type have no input ports and no output ports, and the first design object is of the first type; and
   compiling the first design object with the set of design objects,
   wherein the design objects of the first type are provided in a VHDL package.

2. A method for structured layout of design objects in a hardware description language, comprising:
   declaring a first design object, the first design object having no input ports and no output ports;
   assigning values to attributes of the first design object, the values of attributes indicative of placement for a set of design objects within the first design object;
   declaring a set of design objects as elements within the first design object, wherein one or more of the set of design objects have input ports and output ports;
   declaring a plurality of design objects of a first type, wherein design objects of the first type have no input ports and no output ports, and the first design object is of the first type; and
   compiling the first design object with the set of design objects, wherein
   the design objects of the first type include a vector object and an interleave object;
   the vector object and interleave object each having an associated first attribute value indicating whether the design object is a row or column, and further having a second attribute value indicating a direction in which slots in the design object are filled; and
   the interleave object further having an associated third attribute value indicating a pattern that defines placement of objects within the interleave object.

3. The method of claim 2, wherein the design objects of the first type further include an overlap object defining placement of the set of design objects superimposed in the first design object.

4. The method of claim 2, wherein the design objects of the first type further include a remap object specifying combining the set of design objects with one another in the first design object.

5. The method of claim 2, wherein the design objects of the first type further include a relationally placed macro object specifying relative placement of the set of design objects in the first design object.

6. The method of claim 2, wherein the design objects of the first type further include an indivisible object for specifying placement of a single design object.

7. The method of claim 2, wherein the design objects of the first type further include a flexible object for containing the set of design objects without specification of placement of the set of design objects in the first design object.

8. The method of claim 2, wherein the first design object is declared as a VHDL component having no ports, and the attribute values of the template are specified with VHDL attribute statements.

9. The method of claim 2, wherein the design objects of the first type further have associated attributes indicating a number of slots to be filled in a row or column of the first design object before commencing filling another row or column.

10. The method of claim 2, wherein the design objects of the first type further have associated attributes indicating a number of design objects to be placed in slots in a row or column of the first design object before commencing filling another row or column.

11. A method for structured layout of design objects in a hardware description language, comprising:
   declaring a first design object, the first design object having no input ports and no output ports;
   assigning values to attributes of the first design object, the values of attributes indicative of placement for a set of design objects within the first design object;
   declaring a set of design objects as elements within the first design object, wherein one or more of the set of design objects have input ports and output ports; and
   compiling the first design object with the set of design objects, wherein lexicographic ordering of design object declarations defines an order of the set of design objects in the first design object.

12. A method for structured layout of design objects in a hardware description language, comprising:

declaring a first-level design object, the first-level design object having no input ports and no output ports and further having one or more slots available for one or more second-level design objects;

assigning values to attributes of the first-level design object, the values of attributes being indicative of placement for the second-level design objects in the one or more slots available within the first-level design object;

declaring the second-level design objects as elements within the first-level design object; and compiling the first-level design object with the second-level design objects, wherein a set of second-level design objects includes one or more of the second-level design objects having no input ports and no output ports, and each member of the set of second-level design objects has one or more slots available for one or more third-level design objects, the method further comprising:

assigning values to attributes of the second-level design objects, the values of the attributes being indicative of placement for the third-level design objects in the one or more slots available within the second-level design objects;

declaring the third-level design objects as elements within the second-level design objects in the set;

compiling the set of second-level design objects with the third-level design objects; and declaring one or more additional levels of design objects contained within the third-level design objects.

13. A method for structured layout of design objects in a hardware description language, comprising:

declaring a first-level design object, the first-level design object having no input ports and no output ports and further having one or more slots available for one or more second-level design objects;

assigning values to attributes of the first-level design object, the values of attributes being indicative of placement for the second-level design objects in the one or more slots available within the first-level design object;

declaring the second-level design objects as elements within the first-level design object; and compiling the first-level design object with the second-level design objects, wherein the second-level design objects have defined input and output ports.

14. A method for structured layout of design objects in a hardware description language, comprising:

declaring a first-level design object, the first-level design object having no input ports and no output ports and further having one or more slots available for one or more second-level design objects;

assigning values to attributes of the first-level design object, the values of attributes being indicative of placement for the second-level design objects in the one or more slots available within the first-level design object;

declaring the second-level design objects as elements within the first-level design object;

declaring a plurality of design objects of a first type, wherein objects of the first type have no input ports and no output ports, and the first design object is of the first type; and compiling the first-level design object with the second-level design objects.

15. The method of claim 14, wherein the design objects of the first type are provided in a VHDL package.

16. A method for structured layout of design objects in a hardware description language, comprising:

declaring a first-level design object, the first-level design object having no input ports and no output ports and further having one or more slots available for one or more second-level design objects;

assigning values to attributes of the first-level design object, the values of attributes being indicative of placement for the second-level design objects in the one or more slots available within the first-level design object;

declaring the second-level design objects as elements within the first-level design object; and compiling the first-level design object with the second-level design objects, wherein the first-level design object is declared as a VHDL component having no ports, and the attribute values of the template are specified with VHDL attribute statements.

17. A method for structured layout of design objects in a hardware description language, comprising:

declaring a first-level design object, the first-level design object having no input ports and no output ports and further having one or more slots available for one or more second-level design objects;

assigning values to attributes of the first-level design object, the values of attributes being indicative of placement for the second-level design objects in the one or more slots available within the first-level design object;

declaring the second-level design objects as elements within the first-level design object; and compiling the first-level design object with the second-level design objects, wherein lexicographic ordering of second-level design object declarations defines an order of the second-level design objects in the first-level design object.

* * * * *